(12) United States Patent
Divakar et al.

(10) Patent No.: US 6,603,650 B1
(45) Date of Patent: Aug. 5, 2003

(54) ELECTROSTATIC CHUCK SUSCEPTOR AND METHOD FOR FABRICATION

(75) Inventors: Ramesh Divakar, Shrewsbury, MA (US); Morteza Zandi, Shrewsbury, MA (US)

(73) Assignee: Saint-Gobain Ceramics and Plastics, Inc., Worcester, MA (US)

( * ) Notice: Subject to any disclaimer, the term of this patent is extended or adjusted under 35 U.S.C. 154(b) by 0 days.

(21) Appl. No.: 09/457,968

(22) Filed: Dec. 9, 1999

(51) Int. Cl.$^7$ ................................................ H02H 23/00
(52) U.S. Cl. ....................................... 361/234; 361/233
(58) Field of Search .............................. 361/234, 233, 361/115; 279/128; 156/345; 118/728

(56) References Cited

U.S. PATENT DOCUMENTS

| | | | |
|---|---|---|---|
| 4,652,318 A | 3/1987 | Masuda et al. | 156/89 |
| 4,778,778 A | 10/1988 | Mallia et al. | 501/96 |

(List continued on next page.)

FOREIGN PATENT DOCUMENTS

| | | |
|---|---|---|
| EP | 0 360 529 A2 | 3/1990 |
| EP | 0 506 537 A1 | 9/1992 |
| EP | 0 680 075 A | 11/1995 |
| EP | 0771 772 A2 | 5/1997 |
| EP | 0 791956 A | 8/1997 |
| EP | 0 855 764 | 7/1998 |
| EP | 0 856 881 A2 | 8/1998 |
| EP | 0 882689 A2 | 12/1998 |
| EP | 0 886 312 | 12/1998 |
| EP | 1 030 364 A2 | 8/2000 |
| WO | WO 97/35816 | 10/1996 |

OTHER PUBLICATIONS

Baker, H., et al., Eds., 3.56/Ternary Alloy Phase Diagrams, *ASM Handbook*, vol. 3 (1992).
Hansen, M., "Constitution of Binary Alloys," 482–483, 518–519, 968–969 and 1057–1059 (1958).
Hazelton, C., et al., "Effect of Neutron Radiation on the Dielectric, Mechanical and Thermal Properties of Ceramics for RF Transmission Windows," *Journal of Nuclear Materials* 253:190–195 (1998).
Kuramoto, N., et al., "Translucent AlN Ceramic Substrate," *IEEE Transactions on Components, Hybrids, and Manufacturing Technology* vol. CHMT–9:4:386–390 (1986).
Zulfequar, M. and Kumar, A., "Electrical Conductivity of Hot–pressed AlN Ceramic: Effecti of Various Oxide Additives," *Journal of Materials Science* 22:4056–4060 (1987).

*Primary Examiner*—Stephen W. Jackson
(74) *Attorney, Agent, or Firm*—Toler, Larson & Abel, LLP

(57) ABSTRACT

An electrostatic chuck, or susceptor, includes an electrode and/or heating element embedded in a ceramic body, and has an electrical contact extending from the electrode. The electrode or heating element can be fabricated, for example, from molybdenum and the chuck body from aluminum nitride. The electrical contact includes a first metal and a second metal in a composition ratio wherein essentially all of the second metal is dissolved in the first metal, thereby essentially preventing formation of intermetallic species of the first and second metals. One example of an electrical contact includes about 99.8 weight percent molybdenum and about 0.2 weight percent nickel. Alternatively, the electrode can be fabricated from a first metal and a second metal in a composition ratio wherein essentially all of the second metal is dissolved in the first metal, thereby essentially preventing formation of intermetallic species of the first and second metals. The electrical contact can be fabricated from a metal such as molybdenum, or from an alloy of a first and second metal wherein essentially all of the second metal is dissolved in the first metal. The electrical contact can be formed in situ by the densification of a premixed metal powder precursor during the hot pressing step employed in fabricating the electrostatic chuck.

30 Claims, 7 Drawing Sheets

U.S. PATENT DOCUMENTS

| | | | |
|---|---|---|---|
| 4,908,173 A | 3/1990 | Schwetz et al. | 264/63 |
| 4,922,099 A | 5/1990 | Masuda et al. | 250/324 |
| 4,992,253 A | 2/1991 | Wu et al. | 423/412 |
| 5,280,156 A | 1/1994 | Niori et al. | 219/384 |
| 5,306,895 A | 4/1994 | Ushikoshi et al. | 219/385 |
| 5,320,990 A | 6/1994 | Guiton et al. | 501/98 |
| 5,343,150 A | 8/1994 | Nakahata et al. | 324/316 |
| 5,413,360 A | 5/1995 | Atari et al. | 279/128 |
| 5,522,131 A | 6/1996 | Steger | 29/829 |
| 5,541,145 A | 7/1996 | Harris et al. | 501/96 |
| 5,560,780 A | 10/1996 | Wu et al. | 118/728 |
| 5,607,541 A | 3/1997 | Kubota et al. | 156/538 |
| 5,633,073 A * | 5/1997 | Cheung et al. | 428/209 |
| 5,677,253 A | 10/1997 | Inoue et al. | 501/98 |
| 5,705,450 A | 1/1998 | Chiao | 501/98 |
| 5,708,557 A | 1/1998 | Feigenbaum et al. | 361/234 |
| 5,728,635 A | 3/1998 | Kobayashi et al. | 501/98.4 |
| 5,753,132 A | 5/1998 | Shamouilian et al. | 216/33 |
| 5,800,618 A | 9/1998 | Niori et al. | 118/723 E |
| 5,817,406 A | 10/1998 | Cheung et al. | 428/210 |
| 5,880,922 A | 3/1999 | Husain | 361/234 |
| 5,886,863 A | 3/1999 | Nagasaki et al. | 361/234 |
| 5,908,799 A | 6/1999 | Kobayashi et al. | 501/98.4 |
| 5,909,355 A | 6/1999 | Parkhe | 361/234 |
| 5,923,521 A | 7/1999 | Burkhart | 361/234 |
| 5,958,813 A | 9/1999 | Aida et al. | 501/98.4 |

* cited by examiner

ELECTROSTATIC CHUCK SUSCEPTOR AND METHOD FOR FABRICATION

BACKGROUND OF THE INVENTION

Electrostatic chucks, also known as susceptors, are employed to support various substrates, such as wafers, during manufacture of semiconductor devices. Wafers are secured to a chucking surface by an electrostatic force generated between an external electrode and an electrode embedded in a dielectric chuck body. A heating element also can be embedded in the chuck body.

The electrode and the optional embedded heating element are connected to a power source by electrical contacts, or terminals. However, limitations in the methods of manufacturing electrostatic chucks and, frequently, other design factors, require that the electrode and/or heating element be manufactured separately from the contact. For example, the electrode and/or heating element sometimes is prefabricated, and the terminal, or terminals, must be bonded to it. In addition, the dielectric material of the chuck body typically is formed by firing a green form. The dimensions of green form change during firing, often necessitating that the electrical contacts be attached after formation of the chuck body. A common method for forming a joint layer between the electrode and a connector is by brazing. Another method, employed post-sintering for forming an electrical contact, includes a nickel-molybdenum eutectic composition.

One disadvantage in the use of eutectic compositions as contacts is their tendency to form intermetallic compounds. Since generally such intermetallic compounds are brittle, they can cause the electrical contact to fracture, thereby causing the chuck to fail.

Therefore, a need exists for an electrostatic chuck, and a method for fabricating an electrostatic chuck, that minimizes or overcomes the above-referenced problems.

SUMMARY OF THE INVENTION

It has been found that Mo—Ni contacts having low Ni contents are less likely to fracture during use. Without wishing to be tied to a theory, it is believed that conventional contacts made from intermetallic compositions often fail in use because of the brittle nature of intermetallics. It is believed that the absence of intermetallic species in the novel contacts of the present invention minimized or eliminated this failure mode, thereby producing a valuable commercial product having a relatively high resitance to fracture.

Some alloys encompassed within the scope of the contact of the present invention have been found to have coefficients of thermal expansion (CTE's) significantly different from that of the conventional chuck body (typically AlN). In this art, it is preferred that the CTE of the alloy be within about 10% of the CTE of the chuck body. Thus, there is a desire for contacts which have not only no intermetallics but also the appropriate CTE. The present inventors have found that adding certain "CTE-adjusting compounds," such as, for example, tantalum, to the contact, not only adjust the CTE appropriately, but also does not produce intermetallic species.

The present invention is directed to an electrostatic chuck and to a method for fabricating an electrostatic chuck. The invention also generally is directed to a susceptor, such as an electrostatic chuck.

The electrostatic chuck includes a chuck body and an embedded electrode. A electrical contact extends from the electrode. At least one of either the electrode or the electrical contact includes an alloy of a first metal and a second metal and both the electrode and the electrical contact include the first metal. In one embodiment of the invention, the contact does not include intermetallic compounds. In another embodiment, essentially all of the second metal is dissolved in the first metal.

The electrostatic chuck of the invention can further include a metallic heating element embedded in the chuck body. The optional heating element can include a first metal. An electrical contact, including an alloy having a metal component common to the metallic heating element, the alloy consisting essentially of a solution of metal elements.

In still another embodiment, a susceptor of the invention includes a ceramic body and a metallic element embedded in the ceramic body. At least one electrical contact extends from the metallic element. At least one of either the metallic element or the electrical contact includes an alloy of a first metal and a second metal and both the metallic element and the electrical contact include the first metal. In one embodiment of the invention, the contact does not include intermetallic compounds. In another embodiment, essentially all of the second metal is dissolved in the first metal. Examples of metallic elements include but are not limited to electrodes or heating elements.

In a preferred embodiment, the chuck or susceptor ceramic body is fabricated from aluminum nitride. The first metal can include, for example, molybdenum, tungsten or combinations thereof. In addition to the first metal, the electrical contact includes a second metal, such as, for example, nickel, cobalt or combinations thereof. The amount of the second metal present in the contact essentially prevents intermetallic compounds from forming between the first metal and the second metal.

The method of the invention includes the steps of molding a first portion of a ceramic precursor, forming a recess in the first portion of the ceramic precursor and depositing an electrical contact or an electrical contact precursor in the recess. In one embodiment, the electrical contact or electrical contact precursor includes a first metal and a second metal. The method also includes the steps of depositing an electrode or an electrode precursor onto the first portion of the ceramic precursor, whereby the electrode or electrode precursor overlays the electrical contact or electrical contact precursor, and molding a second portion of a ceramic precursor onto the electrode or electrode precursor. The method further includes heating the ceramic precursor, thereby forming the electrostatic chuck. In one embodiment of the invention, the ceramic precursor is a green form of aluminum nitride. In a preferred embodiment the same ceramic material is employed to form the first and second portions.

The method of the invention also includes forming a chuck body with an embedded electrode, forming an opening to expose a portion of the electrode, depositing an electrical contact precursor at the exposed portion of the electrode and heating the electrical contact precursor, thereby forming an electrostatic chuck. In one embodiment, the electrode includes an alloy of a first metal and a second metal and the electrical contact precursor includes the first metal. In another embodiment, the electrical contact precursor includes an alloy of the first metal and the second metal and the electrode includes the first metal. In still another embodiment, both the electrode and the electrical contact include an alloy of the first and the second metal. In yet another embodiment, both the electrode and the electrical contact precursor include the same alloy composition.

The method of the invention can further include the step of heating the first portion of the ceramic precursor, prior to depositing the electrode or electrode precursor, to form a first ceramic body.

This invention has many advantages. For example, the electrostatic chuck of the invention has low impedance and good mechanical adherence of the electrical contact to the electrode. By providing a junction wherein the second metal essentially is dissolved completely in the first metal, formation of brittle intermetallic compounds essentially is prevented or minimized, thereby resulting in an electrostatic chuck, or susceptor, of relatively high reliability and robustness.

DETAILED DESCRIPTION OF THE INVENTION

The features and other details of the invention, either as steps of the invention or as combination of parts of the invention, will now be more particularly described with reference to the accompanying drawings and pointed out in the claims. The same numeral present in different figures represents the same item. It will be understood that the particular embodiments of the invention are shown by way of illustration and not as limitations of the invention. The principle feature of this invention may be employed in various embodiments without departing from the scope of the invention.

The invention relates to an electrostatic chuck, or susceptor. The susceptor includes a metallic element embedded in a ceramic body. The metallic element can be, for example, a heating element or an electrode and includes a first metal. At least one electrical contact extends from the metallic element and includes an alloy. The alloy includes a first metal and a second metal, wherein essentially all of the second metal is dissolved in the first metal.

Figure 1:
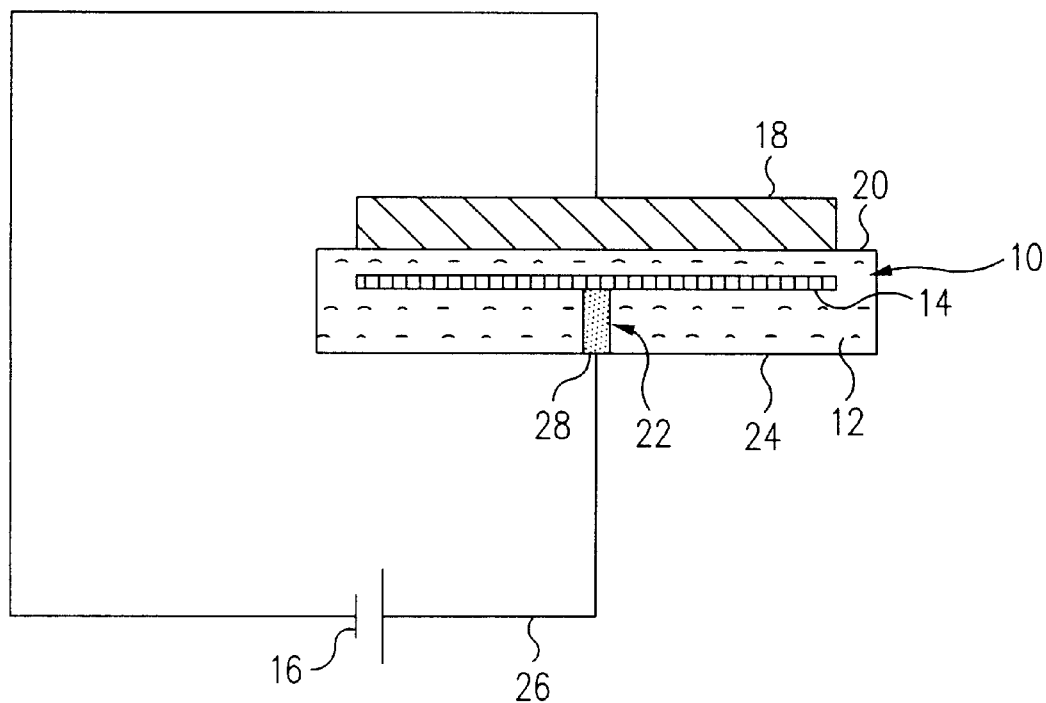
FIG. 1 is a vertical cross-sectional diagram of one embodiment of the electrostatic chuck, or susceptor, of the invention.

FIG. 1 is a schematic diagram of electrostatic chuck 10, of one embodiment of the invention. Electrostatic chuck 10 includes chuck body 12. Electrode 14 is embedded in chuck body 12. During operation, electrostatic chuck 10 is positioned through mechanical supports, not shown in FIG. 1, in a process chamber, also not shown. Voltage from power supply 16 is applied between electrode 14 and workpiece 18, such as, for example, a semiconductor wafer, thereby securing workpiece 18 onto chucking surface 20 of electrostatic chuck 10.

Materials useful in forming chuck body 12 include but are not limited to ceramic materials such as aluminum nitride (AlN), aluminum oxide (Al2O3), boron nitride (BN) and any combinations thereof. Aluminum nitride (AlN) is preferred. Depending on the dielectrical properties of the ceramic material, electrostatic chuck 10 can be a coulombic type electrostatic chuck, a Johnson-Rahbeck type electrostatic chuck or another chuck or susceptor such as known in the art.

Electrostatic chuck 10 has an electrode which is within chuck body 12. Embedding protects electrode 14 from corrosive gases present in the process chamber during wafer manufacture. Typically, the distance between embedded electrode 14 and chucking surface 20 ranges from about 0.5 millimeter and about 2 millimeter. Electrostatic chuck 10 can have, for example, a monolithic, layered or laminated structure or another structure suitable for fabricating electrostatic chucks for which the electrode is not in direct physical contact with workpiece 18.

Electrode 14 can be, for example an electrostatic electrode. Examples of other electrodes which can be employed in the chuck or susceptor of the invention include but are not limited to plasma generating and radio frequency (RF) electrodes.

More than one electrode can be embedded within chuck body 12. For example, an electrostatic chuck of the invention can include a plurality of electrode layers, not shown. In this case, each layer can be energized independently, employing a contact such as further discussed below.

Electrode 14 can be a foil, a perforated foil, a solid plate, a perforated plate, a mesh, a screen printed layer or can have some other configuration that is suitable for incorporation into electrostatic chucks or susceptors. Electrode 14 can be fabricated from a suitable metal or from a combination of metals. Preferably, electrode 14 includes molybdenum (Mo), tungsten (W), or combinations of molybdenum and tungsten. Optionally, a Mo, W or Mo—W electrode can include additional metals, such as, for example, nickel (Ni) or cobalt (Co). Other suitable metals that can be employed to fabricate electrode 14 include, but are not limited to tantalum (Ta), platinum (Pt), rhodium (Rh) and hafnium (Hf).

Electrical contact 22 extends from electrode 14. In one embodiment, electrical contact 22 extends to surface 24 of chuck body 12. In another embodiment a shorter electrical contact, formed as further described below, extends from electrode 14 and joins electrode 14 to a connector, not shown in the FIG. 1. Electrical contact 22, also referred to herein as a termination, allows electrical power to be supplied to electrode 14. External electrical connection to power supply 16 can be through cable 26 which generally connects power supply 16 to end 28 of electrical contact 22. Alternatively, a connector, not shown in the FIG. 1, can be employed to connect electrical contact 22 to cable 26. Cable 26 and means of connecting it to end 28 are known by those skilled in the art.

At least one of either electrode 14 or electrical contact 22 is fabricated from a metal alloy or mixture which includes a first and second metal. Essentially no intermetallic compounds are present in the metal alloy or mixture. Essentially all of the second metal is dissolved in the first metal, whereby formation of intermetallic or other additional phases essentially is prevented. It is believed that, by limiting the amount of second metal to levels that essentially prevent formation of intermetallic species, brittleness at the interface of the electrical contact and the electrode is significantly reduced or minimized. As a consequence, the likelihood of failure of the electrical contact also is significantly reduced or minimized.

Examples of suitable first metals include, but are not limited to, molybdenum (Mo), tungsten (W) and a combination thereof. Examples of suitable second metals include, but are not limited to, nickel (Ni), cobalt (Co) and combinations thereof.

In one embodiment of the invention, electrode 14 includes the first metal and the electrical contact 22 includes the alloy described above. In another embodiment, electrical contact 22 includes the first metal and electrode 14 includes the alloy described above. In yet another embodiment, both electrode 14 and contact 22 include the alloy described above.

Figure 2:
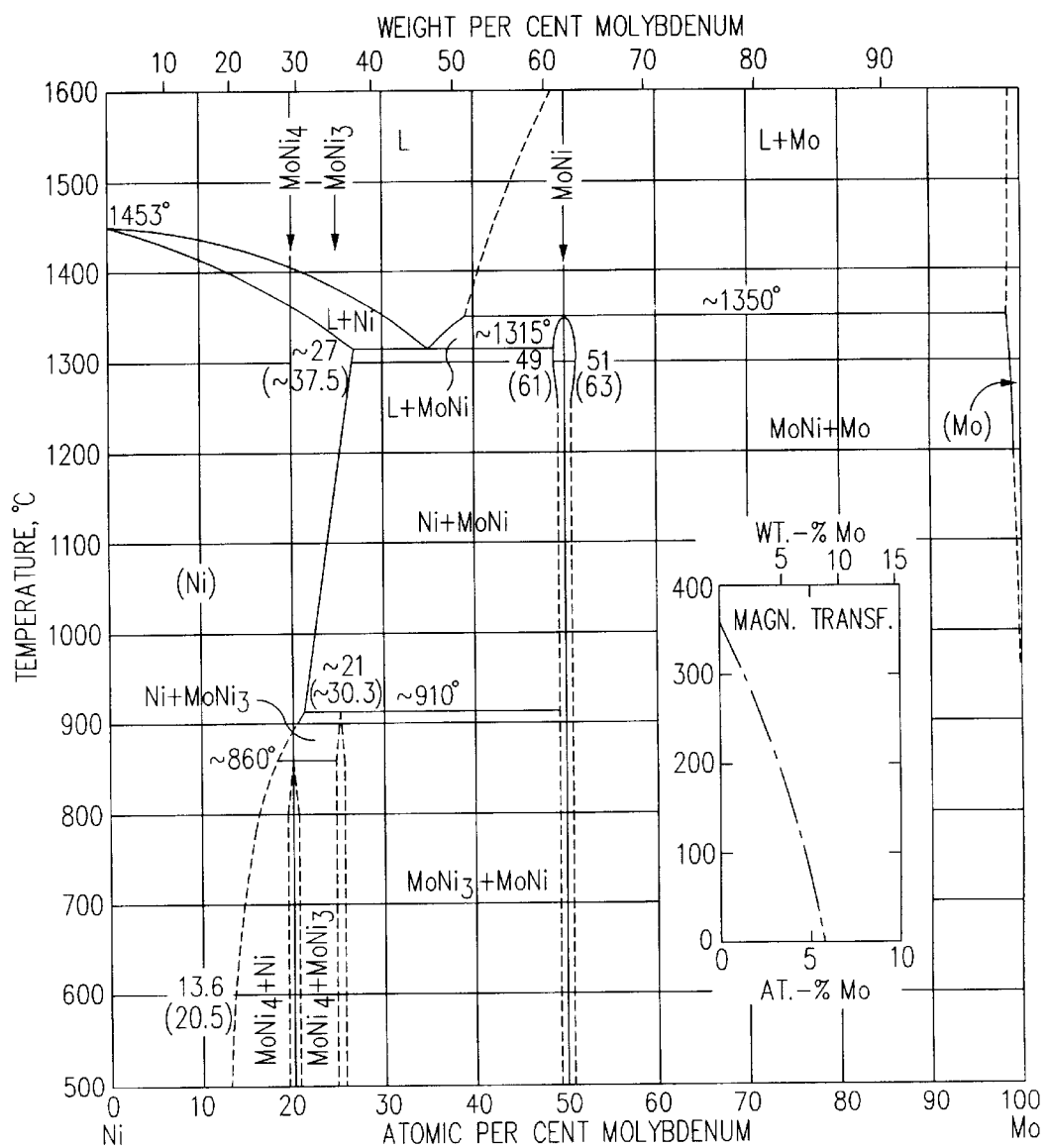
FIG. 2 is a binary phase diagram of a Mo—Ni system.
Figure 3:
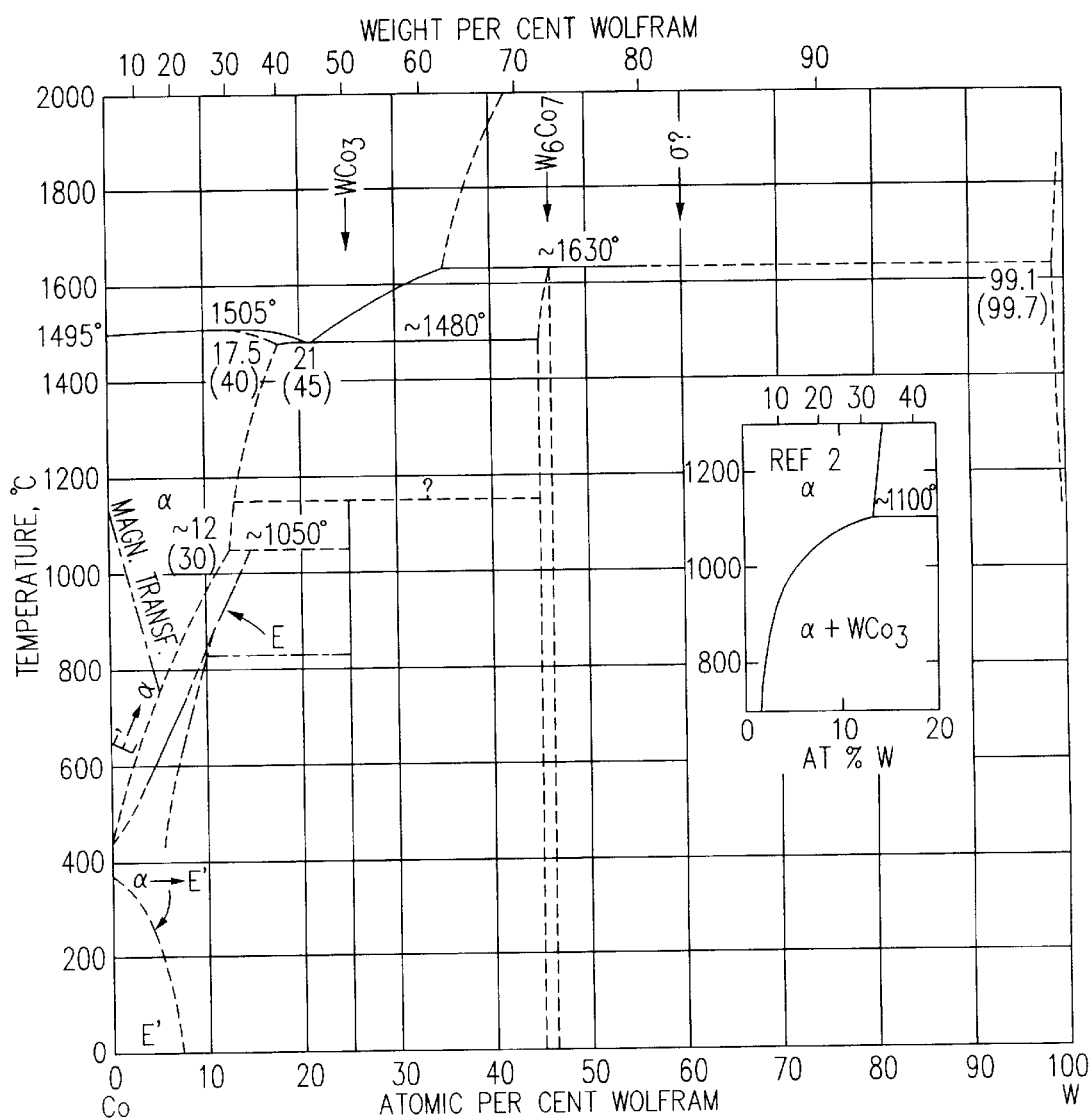
FIG. 3 is a binary phase diagram of a W—Co system.
Figure 4:
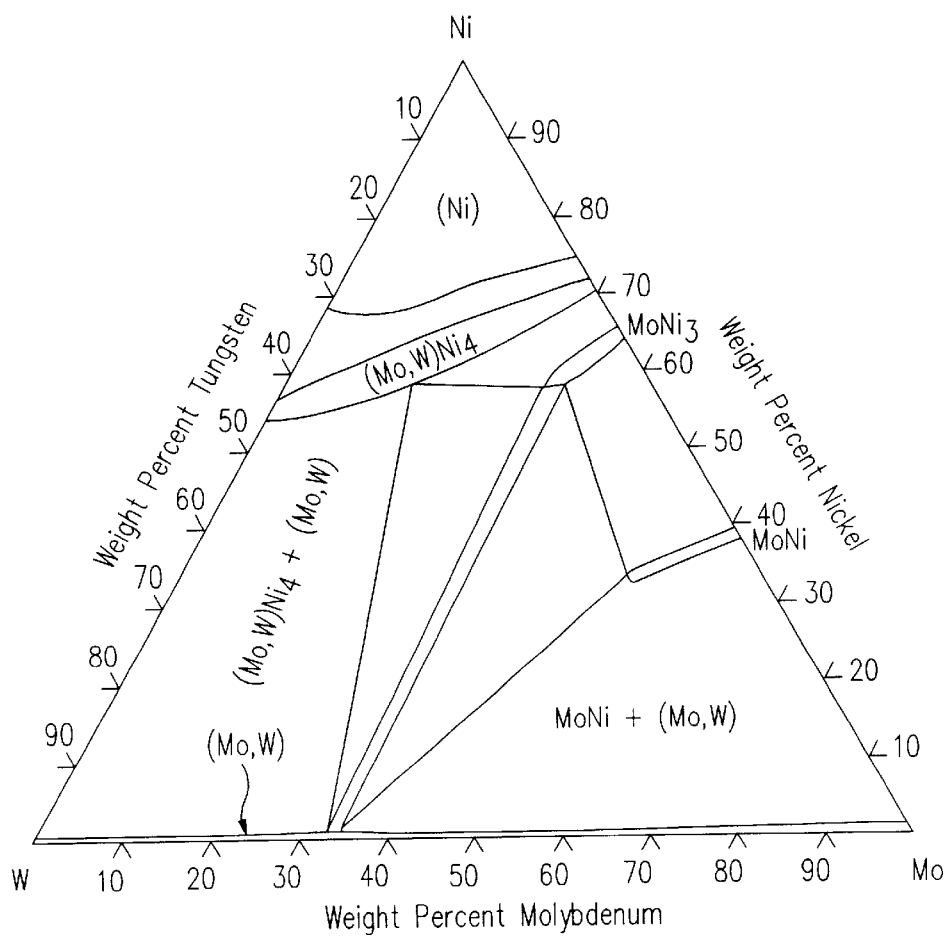
FIG. 4 is a ternary Mo—W—Ni isothermal section at 700° C.
Figure 5:
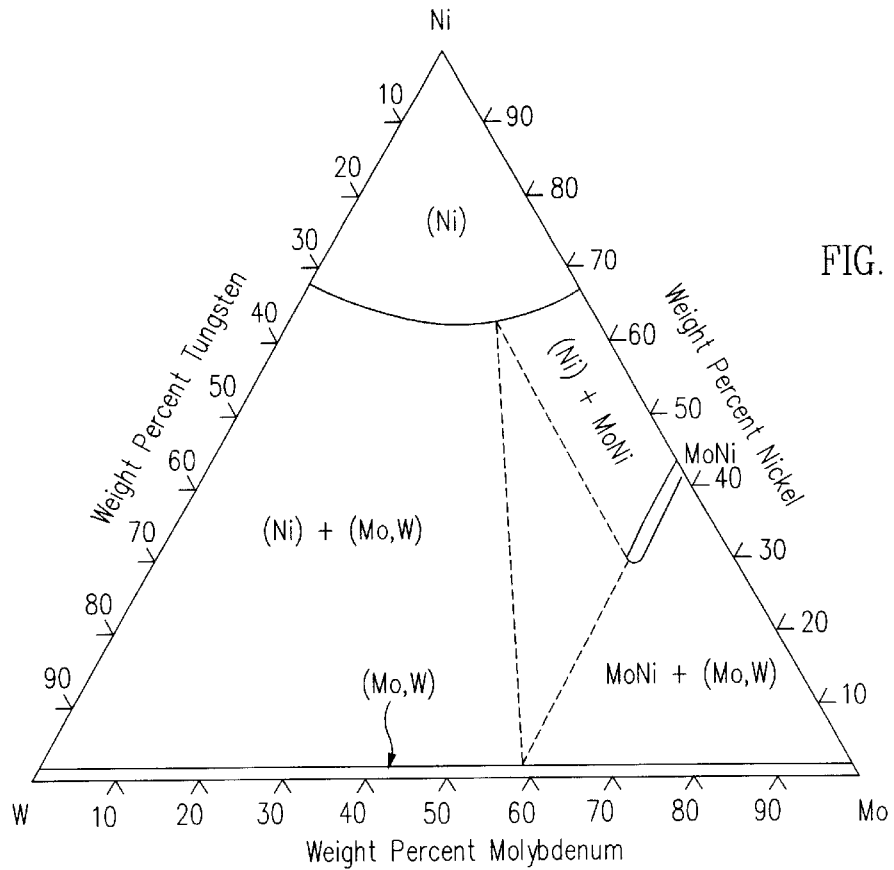
FIG. 5 is a ternary Mo—W—Ni isothermal section at 1000° C.

Preferred first-second metal combinations include but are not limited to Mo—Ni, Mo—Co, W—Ni, W—Co, Mo—W—Ni and Mo—W—Co. Compositions which can be employed in fabricating electrical contact 22 without forming brittle intermetallic compounds and/or additional phases can be selected, for example, from phase diagrams or isotherms of the component metals. Such phase diagrams and isotherms are available for a number of binary and ternary systems and examples are shown in FIG. 2: binary phase diagrams for Mo—Ni; FIG. 3 binary phase diagram for W—Co; FIG. 4: ternary isotherm for the Mo—Ni—W system at 700° C.; and FIG. 5: ternary isotherm for the Mo—Ni—W system at 1000° C.

First-second metal combinations suitable in the fabrication of electrical contact 22 and/or of electrode 14, their preferred compositions ranges as well as maximum desirable contents of the second metal are shown in Table 1.

| Electrode/Contact Metal Compositions | | | |
| --- | --- | --- | --- |
| First Metal | Second Metal | Maximum Range of Second Metal (wt %)* | Preferred Range of Second Metal (wt %) |
| Mo | Ni | 0.001–5 | 0.01–1 |
| Mo | Co | 0.01–15 | 0.01–6 |
| W | Ni | 0.01–1 | 0.01–0.5 |
| W | Co | 0.01–1 | 0.01–0.5 |
| Mo—W | Ni | 0.01–10 | 0.01–2 |

*This range may result in the formation of the MoNi intermetallic, however, the amounts produced will be small enough not to cause brittleness of the interface between the electrical contact and the electrode.

In one embodiment of the invention, electrical contact 22 has a coefficient of thermal expansion (CTE) about that of the CTE of chuck body 12. Electrical contact 22 can include a suitable additional component present in an amount that does not result in the formation of intermetallic species and/or second phases and causes electrical contact 22 to have a CTE which is about that of chuck body 12. Examples of such components include rhodium (Rh), hafnium (Hf), niobium (Nb), and tantalum (Ta). In a preferred embodiment, chuck body 12 includes aluminum nitride (AlN) and electrical contact 22 has a CTE which is close or matches the CTE of aluminum nitride. For example, the CTE of electrical contact 22 can be within about 10% of the CTE of the chuck body. Typically, an AlN chuck body has a CTE of about $5.0 \times 10^{-6°}$ C.$^{-1}$ at room temperature. Preferred electrical contacts can be fabricated from combinations of Mo (CTE of $5.7 \times 10^{-6°}$ C.$^{-1}$ at room temperature) and W (CTE of $4.6 \times 10^{-6°}$ C.$^{-1}$ at room temperature). It is further preferred to match the CTE of the chuck body 12 and the CTE of electrical contact 22 over the entire range of temperatures that may be encountered during manufacturing, for example from room temperature to 2000° C.

In one embodiment of the invention, the second metal can also promote the sintering/densifiaction of a powder of the first metal. For example, if a premixed powder precursor is employed to form electrical contact 22, a second metal such as Ni can promote the densification of a powder metal such as Mo.

End 28 can be plated with a suitable material to provide resistance to corrosion. A preferred such material is nickel.

Figure 6:
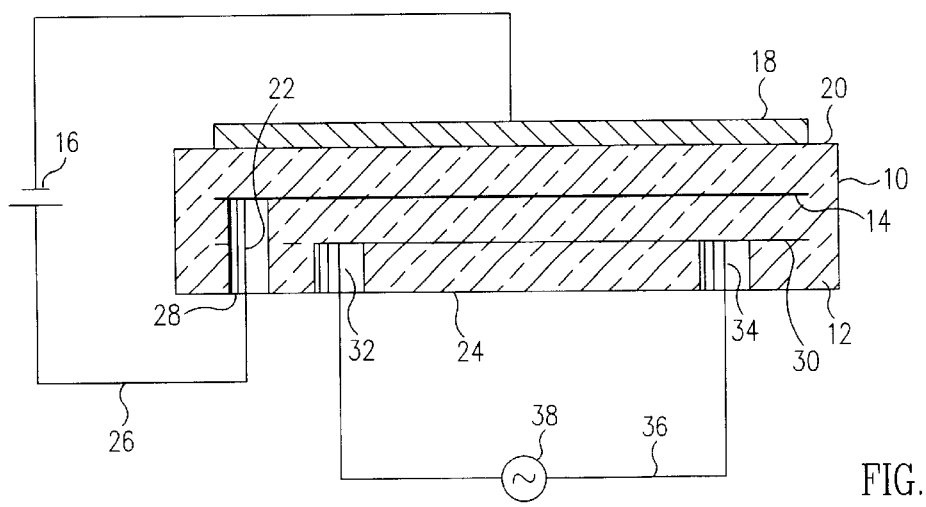
FIG. 6 is a vertical cross-sectional representation of another embodiment of the electrostatic chuck of the invention.

Optionally, as can be seen in FIG. 6, electrostatic chuck 10 includes heating element 30 embedded in chuck body 12. Heating element 30 can be a wire, a coil, a tape or can have other suitable shapes. Electrical contacts 32, 34 extend from heating element 30. Cable 36 connects electrical contacts 32, 34 to electrical power source 38. Heating element 30 can be any suitable means for heating chuck body 12. The materials of construction of heating element 30 and of electrical contacts 32, 34 are the same as is described above for electrode 14 and electrical contact 22.

Figure 7A:
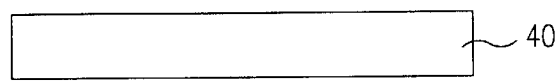
FIGS. 7A–7G are a schematic view of the steps employed by one method of the invention.

The invention also relates to methods of forming an electrostatic chuck. Stages of one embodiment of the method are shown in FIGS. 7A through 7G. As shown in FIG. 7A, the method of the invention includes providing a first portion 40 of chuck body 12. First portion 40 can be formed from a ceramic precursor. For example, first portion 40 can be a green form, for example, a dry compact powder or other suitable ceramic precursor material, that is shaped and pressed in a mold by a suitable method. As used herein, "green" refers to the pre-densified state of a ceramic precursor. If a green form of the ceramic material is used, the density of first portion 40 of chuck body 12 can range, for example, from about 40% to about 60% of the theoretical density of the ceramic material. Examples of suitable precursors include AlN, Al2O3, BN and mixtures thereof. In a preferred embodiment, the ceramic precursor includes AlN. In another preferred embodiment a high purity AlN precursor can be employed, as discussed in U.S. patent application Ser. No. 09/458,278, entitled HIGH-PURITY LOW-RESISTIVITY ELECTROSTATIC CHUCKS, filed on Dec. 9, 1999, which is incorporated herein by reference in its entirety. Alternatively, first portion 40 can be a prefabricated, already densified first portion of 40 of chuck body 12.

Figure 7B:
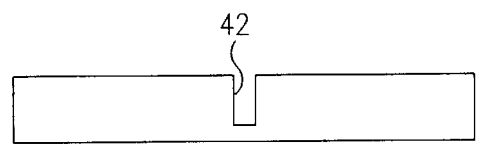

Recess 42, as seen in FIG. 7B, is formed in first portion 40 of chuck body 12. For a prefabricated, densified portion 40, recess 42 can be drilled into the ceramic material. If portion 40 is a green body, the recess can be formed by a pin or by other means known in the art. In one embodiment of the invention, the recess in not a through-hole.

Figure 7C:
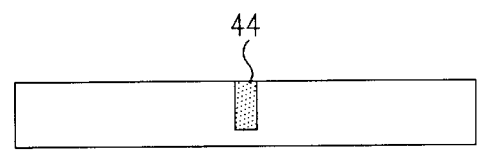

Electrical contact or electrical contact precursor 44, as seen in FIG. 7C, is placed or deposited in recess 42. Electrical contact or electrical contact precursor 44 can be in the form of a plug, strip, wire or pellet, that fits into recess 42. In one embodiment of the invention, electrical contact precursor 44 is in the form of a metal powder which is deposited in recess 42 and compacted in situ. In a preferred embodiment, premixed powders of a first and second metals are placed or deposited in recess 42 and compacted in situ. In another preferred embodiment, the powder or mixture of powders is compacted, for example by forming a plug, to about the same density as that of surrounding first portion 40 of the green form of the ceramic material. The density of the compacted powder can range, for example, from about 40% to about 60% of the theoretical density of the ceramic material.

Figure 7D:
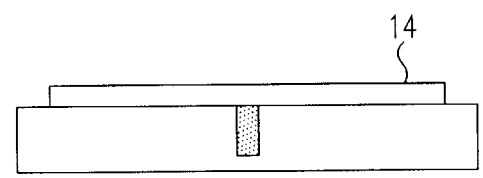

Electrode 14, such as, for example, the electrodes discussed above, is placed or deposited onto first portion 40 and overlays electrical contact precursor 44. The resulting structure is seen in FIG. 7D. Alternatively, a suitable electrode precursor which, upon heating, can form electrode 14, is deposited onto first portion 40 of the green form of the ceramic material and overlays electrical contact precursor 44. An example of an electrode precursor is a metal powder or a bundle metal electrode.

Figure 7E:
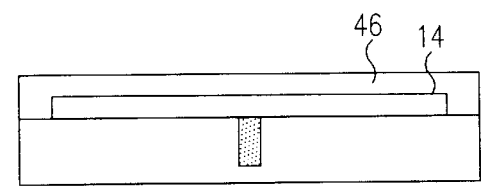

A second portion 46 of a green form of a ceramic material is molded onto electrode 14 or onto a precursor of electrode 14. In a preferred embodiment, both first portion 40 and second portion 46 include the same ceramic material. However, second portion 46 can have a composition which is different from first portion 40. In one embodiment, the second portion includes a high purity AlN material, such as described above. The resulting structure is seen in FIG. 7E. In one embodiment of the invention, additional electrodes, separated by additional layers of the green form can be overlaid onto second portion 46 of the green form of the ceramic material.

Figure 7F:
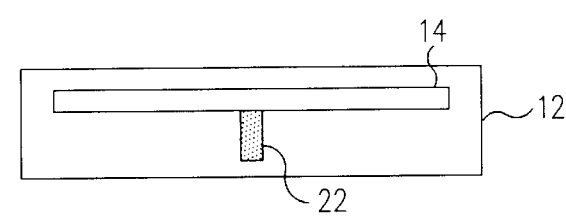

The structure seen in FIG. 7E is heated to obtain an electrostatic chuck, such as is shown in FIG. 7F which includes chuck body 12 and electrical contact 22. In one embodiment of the invention, heating is by hot pressing at temperatures ranging from about 1700° C. to about 2000° C. and pressures from about 10 MPa to about 40 Mpa. Alternatively, heating can be by sintering, without applying pressure, at temperatures ranging from about 1500° C. to about 2000° C.

Figure 7G:
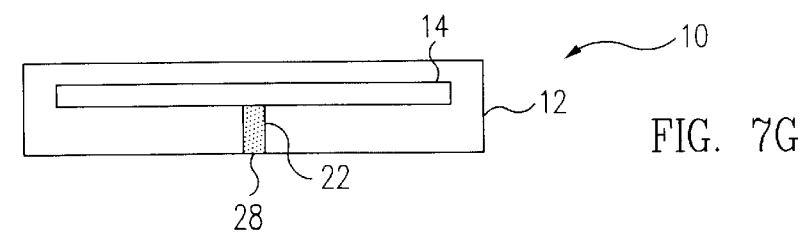

In the case in which recess 42 is not a through-hole, the method of the invention can further include exposing end 28 of electrical contact 22, resulting in electrostatic chuck 10, as seen in FIG. 7G. For example, a layer of ceramic material can be machined away, thereby exposing end 28. Alternatively, a hole can be drilled to expose end 28 of electrical contact 22.

In one embodiment of the invention, steps of which can be seen in FIGS. 8A through 8G, first portion 40 of a green form of a ceramic material including electrical contact precursor 44, deposited in recess 42, is heated prior to the step of depositing the electrode or electrode precursor onto the first portion of the green form. Heating can be, for example, to temperatures ranging from about 1500° C. to about 2000° C. and, optionally, can be accompanied by applying pressure, ranging, for example, from about 10 MPa to about 40 MPa.

The stages of molding first portion 40 of a green form of a ceramic material (FIG. 8A), forming a recess 42 in first portion 40 of the green form of the ceramic material (FIG. 8B) and depositing in recess 42 an electrical contact precursor 44 (FIG. 8C) have been discussed above.

Figure 8A:
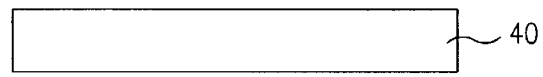
FIGS. 8A–8G are a schematic view of the steps employed by another method of the invention.
Figure 8B:
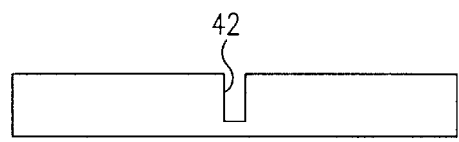
Figure 8C:
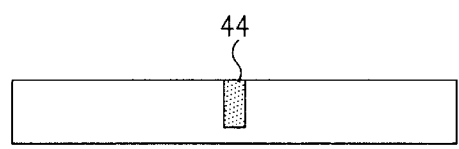
Figure 8D:
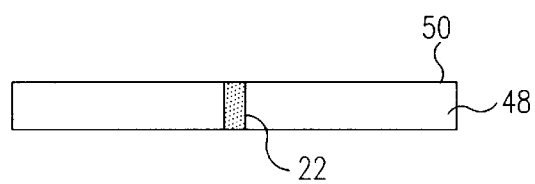
Figure 8E:
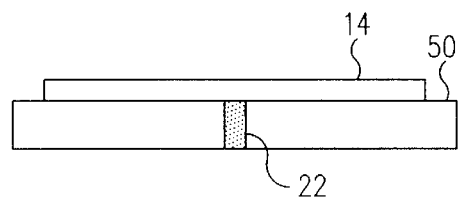

The structure shown in FIG. 8C is heated, for example, by hot pressing, to form ceramic body 48 which includes electrical contact 22. To obtain the structure shown in FIG. 8D, wherein both ends of electrical contact 22 are exposed, a layer of sintered ceramic material can be machined away. Electrode 14 (or an electrode precursor, such as the one described above) is placed or deposited over ceramic body 48, as seen in FIG. 8E. In a preferred embodiment, the electrode is screen printed onto machined face 50. A process for forming an electrostatic chuck having a screen printed electrode is described in U.S. patent application Ser. No. 09/730,487, entitled ELECTROSTATIC CHUCKS WITH FLAT FILM ELECTRODE, filed on Dec. 5, 2000, which is incorporated herein by reference in its entirety.

Figure 8F:
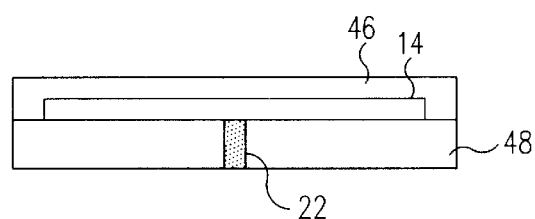
Figure 8G:
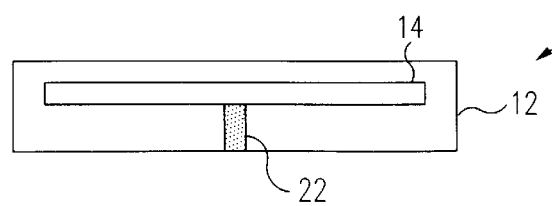

Second portion 46 of the green form of the ceramic material is placed onto electrode 14 (or a electrode precursor) to form the structure seen in FIG. 8F. The resulting assembly is heated, as discussed above, thereby forming electrostatic chuck 10 seen in FIG. 8G.

Under the heating conditions described above, an electrical connection is also formed between electrode 14 and electrical contact 22 as metal atoms diffuse between the two, i.e, diffusion bonding occurs.

Chuck 10 can be cooled and optionally heat treated, typically at soak temperatures ranging between about 1500° C. and about 1750° C.

The length of electrical contact 22 can vary. Short electrical contacts are preferred. The degree of CTE mismatch between electrical contact 22 and the surrounding ceramic material and the formation of bumps and/or cracking at the interface between electrode 14 and electrical contact 22 can be reduced or eliminated as the length of electrical contact 22 is decreased. For example, electrical contact 22 can have a composition such that, when heated, for example during heat treatment, its CTE mismatch results in the formation of bumps and cracking for a length of about 9 mm. Reducing the length of the electrical contact from about 9 mm to about 2 mm and preferably to about 1 mm can significantly reduce or eliminate the formation of bumps and/or cracking.

Electrical contact 22 can be formed also after electrostatic chuck 10 with embedded electrode 14 has been sintered. A hole or conduit can be formed, for example by drilling, to expose electrode 14.

In one embodiment, an electrical contact precursor, for example, a powder including a first metal and a second metal, such as described above, is deposited in the hole, at electrode 14. A preferred composition of the powder includes 99.8% Mo and 0.2% Ni. In one embodiment, the electrical contact precursor placed in the hole does not extend to surface 24 and a connector can be employed to join electrical contact 22 to cable 26, with one end of the connector in physical contact with the electrical contact precursor. The connector can include the first metal (e.g. Mo). The assembly is heated and held at a temperature and for a period of time suitable to form an electrical contact, for example, a temperature of about 1650° C. to about 1750° C. and for a period of at least 0.5 hours. A nitrogen deficient atmosphere can be employed. An atmosphere and method suitable for forming the electrical contact are described in U.S. patent application Ser. No. 09/458,278, entitled HIGH-PURITY LOW-RESISTIVITY ELECTROSTATIC CHUCKS, filed on Dec. 9, 1999, which is incorporated herein by reference in its entirety. The resulting electrical contact is firmly attached at electrode 14 and, under pull testing, is stronger than contacts formed by employing commercial active metal brazes, such as, for example, Ag—Cu—Sn—Ti brazes, wherein Ag and Cu are the major components (e.g., 85–90%) of the braze. The electrical contact extends from electrode 14 by a length such as, for example, ranging from about 10 microns to about 100 microns.

In another embodiment, the electrode is fabricated from an alloy of a first and second metal, such as described above, for example an alloy having a 99.8% Mo–0.2% Ni composition. In a preferred embodiment, the electrode is screen printed, as described in U.S. patent application Ser. No. 09/730,487, entitled ELECTROSTATIC CHUCKS WITH FLAT FILM ELECTRODE, filed on Dec. 5, 2000, which is incorporated herein by reference in its entirety. An electrical contact precursor including the first metal, for example Mo, is placed into the hole. The electrical contact precursor can be, for example, a metal cylindrical rod, metal pellet, a metal wire or can have another suitable shape. The assembly is heated and held at a temperature and for a period of time sufficient to join the electrical contact precursor to electrode 14. For example, heating can be at a temperature of about 1650° C. to about 1750° C. and for a period of at least 0.5 hours. A suitable process in which an atmosphere deficient in nitrogen is employed is described in U.S. patent application Ser. No. 09/458,278, entitled HIGH-PURITY LOW-RESISTIVITY ELECTROSTATIC CHUCKS, filed on Dec. 9, 1999, which is incorporated herein by reference in its entirety.

The invention is further described through the following example which is provided for illustrative purposes and is not intended to be limiting.

EXEMPLIFICATION

High purity AlN powder was filled into a mold cavity formed by a graphite spacer and a thin sheet of graphite ("grafoil") at the bottom and a cylindrical graphite sleeve—typically used in a hot pressing process. Grafoil was obtained from UCAR Carbon Company, Inc. The AlN powder was compacted by pressing on it with a pressing plate. The compact had a cylindrical hole formed in it by using a pin in the pressing plate. The hole was not a through-hole so that any reaction between the termination (electrical contact) composition and the graphite spacer was prevented. Separately, pre-mixed metal powder including the metallurgy of the electrical contact (or termination) was compacted in a cylindrical steel die so that a clinical "plug" was obtained. The premixed metal powder consisted of 99.8 weight percent molybdenum and 0.2 weight percent Ni. The premixed powder was obtained from Atlantic Equipment Engineers. The "plug" was compacted to approximately the green density of the surrounding AlN compact (measured as a percent of theoretical density) so that shrinkage of the AlN and that of the termination was identical during densification. The plug was placed in the previously formed hole in the AlN green compact. A chucking—or plasma-capable Mo electrode was placed on the surface of the green AlN compact and in physical contact with the premixed metal powder in the compacted plug. Additional AlN powder was added on top of the electrode and the entire assembly was further compacted so that a composite green body with an embedded electrode layer and termination was obtained. A thin sheet of graphite ("grafoil") and a flat graphite spacer was placed on top of the assembly. The assembly was hot pressed at 1850° C. and 20 MPa pressure in nitrogen to accomplish densification. A cross-section of the hot-pressed composite AlN body showed that there was excellent contact between the electrical contact (termination) and the electrode with no intermetallic compounds or other defects such as cracks or large pores at the ceramic interface.

EQUIVALENTS

Those skilled in the art will recognize, or be able to ascertain using no more than routine experimentation, many equivalents to the specific embodiments of the invention described specifically herein. Such equivalents are intended to be encompassed in the scope of the following claims

What is claimed is:
1. An electrostatic chuck, comprising:
   a) a chuck body;
   b) an electrode, said electrode being embedded in the chuck body; and
   c) an electrical contact extending from the electrode;
wherein both the electrode and the electrical contact include a first metal and at least one of either the electrical contact or the electrode includes an alloy of the first metal and a second metal, all of said second metal being essentially dissolved in the first metal.

2. The electrostatic chuck of claim 1, wherein the first metal is selected from the group consisting of molybdenum, tungsten and a combination thereof.

3. The electrostatic chuck of claim 1, wherein the second metal is selected from the group consisting of nickel and cobalt and a combination thereof.

4. The electrostatic chuck of claim 1, wherein the alloy further includes at least one additional metal.

5. The electrostatic chuck of claim 4, wherein the additional metal is selected from the group consisting of rhodium, niobium, tantalum, hafnium and combinations thereof.

6. The electrostatic chuck of claim 5, wherein the additional metal component of the electrode is present in an amount that causes the coefficient of thermal expansion to be about that of the chuck body.

7. The electrostatic chuck of claim 1, wherein the chuck body includes aluminum nitride.

8. The electrostatic chuck of claim 1, further including a plating at a surface of the electrode.

9. An electrostatic chuck, comprising:
   a) a chuck body;
   b) an electrode including a first metal, said electrode being embedded in the chuck body;
   c) a first electrical contact, said first electrical contact extending from the electrode, and including an alloy of said first metal and a second metal, wherein essentially all of the second metal is dissolved in the first metal;
   d) a metallic heating element embedded in the chuck body; and
   e) a second electrical contact extending from the metallic heating element, said second electrical contact including an alloy having a metal component common to the metallic heating element, said alloy consisting essentially of a solution of metal elements.

10. The method of forming an electrostatic chuck, comprising the steps of:
   a) molding a first portion of a green form of ceramic material;
   b) forming a recess in said first portion of the green form;
   c) depositing an electrical contact precursor in said recess, the electrical contact precursor including a first metal and a second metal;
   d) depositing an electrode or an electrode precursor onto said first portion of the green form, whereby the electrode or electrode precursor overlays said electrical contact precursor;
   e) molding a second portion of the green form of the ceramic material onto the electrode or electrode precursor; and
   f) heating the green form, thereby forming the electrostatic chuck, wherein the second metal of the electrical contact precursor essentially is completely dissolved or essentially completely soluble in the first metal of said electrical contact precursor.

11. The method of claim 10, wherein the electrical contact precursor includes a mixture of a powder of the first metal and a powder of the second metal.

12. The method of claim 10, wherein the electrode or electrode precursor includes the first metal.

13. The method of claim 10, wherein the first metal is selected from the group consisting of molybdenum, tungsten and a combination thereof.

14. The method of claim 10, wherein the second metal is selected from the group consisting of nickel and cobalt.

15. The method of claim 10, wherein the electrical precursor further includes at least one additional metal.

16. The method of claim 15, wherein the additional metal component is selected from the group consisting of rhodium, hafnium, tantalum, niobium and combinations thereof.

17. The method of claim 10, wherein the electrode or electrode precursor includes a metal selected from the group consisting of molybdenum, tungsten and a combination thereof.

18. The method of claim 10, wherein the ceramic material includes aluminum nitride.

19. The method of claim 10, wherein the green form is heated by hot pressing the green form.

20. The method of claim 10, further including the step of heating the first portion of the green form to form a ceramic body, prior to overlaying the electrode or electrode precursor.

21. A method of forming an electrostatic chuck comprising the steps of:
   a) forming a chuck body including an embedded electrode;
   b) forming an opening thereby exposing a portion of the embedded electrode;
   c) depositing an electrical contact precursor at the exposed portion of the electrode, wherein both the electrode and the electrical contact precursor include a first metal and at least one of either the electrode or the electrical contact precursor includes an alloy of said first metal and a second metal, all of the second metal being essentially dissolved in the first metal; and
   d) heating the electrical contact precursor thereby forming the electrostatic chuck.

22. An electrostatic chuck, comprising:
   a) a chuck body;
   b) an electrode including a first metal, said electrode being embedded in the chuck body; and
   c) an electrical contact extending from the electrode, said electrical contact including an alloy of said first metal and a second metal, wherein essentially all of the second metal is dissolved in the first metal.

23. An electrostatic chuck, comprising:
   a) a chuck body;
   b) an electrode embedded in the chuck body, said electrode including an alloy of a first metal and a second metal, wherein essentially all of the second metal is dissolved in the first metal; and
   c) an electrical contact extending from the electrode, said electrical contact including the first metal.

24. The electrostatic chuck of claim 1, wherein said first metal comprises molybdenum, and said second metal comprises at least one of nickel in an amount of about 0.001 to about 5 weight percent and cobalt in an amount of about 0.01 to about 15 weight percent.

25. The electrostatic chuck of claim 24, wherein said second metal comprises at least one of nickel in an amount of about 0.01 to about 1 weight percent and cobalt in an amount of about 0.01 to about 6 weight percent.

26. The electrostatic chuck of claim 1, wherein said first metal comprises tungsten, and said second metal comprises at least one of nickel in an amount of about 0.01 to about 1 weight percent and cobalt in an amount of 0.01 to about 1 weight percent.

27. The electrostatic chuck of claim 26, wherein said second metal comprises at least one of nickel in an amount of about 0.01 to about 0.5 weight percent and cobalt in an amount of about 0.01 to about 0.5 weight percent.

28. The electrostatic chuck of claim 1, wherein said first metal comprises molybdenum and tungsten and said second metal comprises nickel in an amount of about 0.01 to about 10 weight percent.

29. The electrostatic chuck of claim 28, wherein nickel is present in an amount of about 0.01 to about 2 weight percent.

30. The electrostatic chuck of claim 1, wherein the electrode and the electrical contact are free of intermetallic compounds.

* * * * *